United States Patent
Lampe

(10) Patent No.: US 7,987,061 B2
(45) Date of Patent: Jul. 26, 2011

(54) NON-LINEAR FREQUENCY AND PHASE MEASUREMENT SCHEME

(75) Inventor: Alexander Lampe, Leipzig (DE)

(73) Assignee: ST-Ericsson SA, Plan-les-Ouates (CH)

( * ) Notice: Subject to any disclaimer, the term of this patent is extended or adjusted under 35 U.S.C. 154(b) by 717 days.

(21) Appl. No.: 11/577,088

(22) PCT Filed: Sep. 26, 2005

(86) PCT No.: PCT/IB2005/053177
§ 371 (c)(1),
(2), (4) Date: Apr. 11, 2007

(87) PCT Pub. No.: WO2006/040699
PCT Pub. Date: Apr. 20, 2006

(65) Prior Publication Data
US 2009/0030629 A1  Jan. 29, 2009

(30) Foreign Application Priority Data

Oct. 11, 2004  (EP) .................................. 04104975

(51) Int. Cl.
*G01R 25/08* (2006.01)
(52) U.S. Cl. ................. 702/79; 702/78; 702/89
(58) Field of Classification Search .............. 702/78, 702/79, 89
See application file for complete search history.

(56) References Cited

U.S. PATENT DOCUMENTS

| 4,350,950 A | 9/1982 | Waldmann et al. |
| 6,452,377 B1 | 9/2002 | Clark |
| 7,013,119 B2 * | 3/2006 | Yamauchi et al. ............ 455/258 |
| 7,130,368 B1 | 10/2006 | Aweya et al. |
| 2003/0117181 A1 | 6/2003 | Powell et al. |

FOREIGN PATENT DOCUMENTS

| EP | 0 484 975 A2 | 5/1992 |
| JP | 2002368670 A * | 12/2002 |
| WO | WO2005005999 A | 1/2005 |

OTHER PUBLICATIONS

Bode, P., A. Lampe, M. Hefenstein, M. Gollnick, Improved Method for Measuring Frequency Ratios in GSM Mobile Phones, Proceedings of the IEEE 2004 Custom Integrated Circuits Conference, pp. 621-624, Oct. 3-6, 2004.*

Bode P et al: "Improved Method for Measuring Frequency Ratios in GSM Mobile Phones"; Custom Intergrated Circuits Conference 2004 Proceedings of the IEEE 2004 Orlando FL; USA Oct. 3-6, 2004; pp. 621-624.

* cited by examiner

*Primary Examiner* — Manuel L Barbee
(74) *Attorney, Agent, or Firm* — Robert Iannucci; Seed IP Law Group PLLC

(57) ABSTRACT

The present invention relates to a method and apparatus for measuring a frequency or a phase of a measuring signal, wherein the frequency ($f_g$) or the phase ($\phi_g$) are estimated by approximating the relationship between a collecting clock (c) and a gating clock (g) based on a non-linear step-shaped function. Thereby, the estimation error can be improved with almost negligible complexity increase in signal processing.

35 Claims, 4 Drawing Sheets

NON-LINEAR FREQUENCY AND PHASE MEASUREMENT SCHEME

The present invention relates to a method and apparatus for measuring a frequency or a phase of a measuring signal. In particular, the present invention relates to an accurate frequency and phase measurement scheme for synchronizing electronic circuits operated from independent clock oscillators.

Electronic circuits for frequency measurement are used in a wide spectrum of electromechanical and electronic systems, such as for instance revolution controllers in Compact Disc (CD) or hard disc drives or interface circuits for the synchronization of electronic subsystems which are operated from independent clock oscillators.

A typical example for the latter ones are GSM (Global System for Mobile communication) mobile phones with GPS (Global Positioning System) capability. In such systems, a GPS receiver on the ground measures the times of arrival of signals from different satellites in the sky. The times of arrival of the signals along with the exact location of the satellites and the exact times the signals were transmitted from each satellite are used to triangulate the position of the GPS receiver. A standard GPS receiver includes a local oscillator used to receive the GPS signal from the satellites. The acquisition of signals from the GPS satellites is highly sensitive to frequency variations in the local oscillator of the GPS receiver. A number of factors contribute to making the acquisition of the GPS signals difficult. As a result, if the GPS receivers local oscillator frequency is even slightly of the GPS frequency, it may be difficult and time consuming to effectively receive the GPS signals.

In a typical example for a GSM mobile phone with GPS capability up to three independent crystal oscillators (XOs) may be used, wherein a 26 MHz XO and a 32 kHz XO supply the GSM subsystem during active time and idle time, respectively, and a 21 MHz XO supplies the GPS subsystem. The 26 MHz XO is required as a clean frequency for the GSM RF (Radio Frequency) synthesizers in GSM active mode, while the low power 32 kHz XO helps reducing the power consumption in GSM idle mode when most of the GSM system including the 26 MHz XO is powered down. Merely the 32 kHz XO and a counter denoted as the 32 kHz 'sleep counter' are active. The sleep counter serves as a timer to power up the GSM system in time before a new paging message sent by the base stations arrives. Due to tolerances and temperature drift of the 32 kHz XO, the GSM mobile phone could easily miss a part of the paging message. This is why GSM mobile phones include a frequency measurement unit which serves for estimating the frequency ration between the 32 kHz XO and the 26 MHz XO. A similar need for frequency measurement arose recently with the development of GPS capable GSM mobile phones. This is because GPS receivers ICs (Integrated Circuits) traditionally use another reference frequency than the standard 26 MHz of GSM and therefore need a dedicated GPS XO.

In both cases, the accuracy requirements lead to measurement periods of several seconds if a conventional frequency measurement unit based on counters is employed. The task of such a frequency measurement unit is to measure the frequency ratio $f_c/f_g$ of two independent digital clock signals which shall be denoted as the gating clock and the collecting clock, corresponding to respective clock frequencies $f_g$, $f_c$ and clock periods $T_g=1/f_g$ and $T_c=1/f_c$. Simple conventional frequency measurement circuits comprise two counters, namely the gating counter and the collecting counter which are clocked by the respective clocks. The gating counter in combination with some comparator logic determines the measurement period by enabling the collecting counter for a certain number of gating counter cycles $N_g$. The number of cycles the collecting counter collects during the measurement period shall be denoted as $N_c$. Expressing the measurement period in multiples of both $T_g$ and $T_c$ leads to the following equation:

$$N_g T_g = N_c T_c + dT_c \qquad (1)$$

where $N_g T_g$ is the measurement period in seconds and the unknown term $dT_c$ with $-1<d<1$ takes into account that the measurement period may be not an integer multiple of $T_c$ while the collecting counter can resolve only integer multiples of $T_c$. Reorganizing the above equation yields the expression $$\frac{f_c}{f_g} = \frac{N_c}{N_g} \cdot \left(1 + \frac{d}{N_c}\right) = \frac{N_c}{N_g} \cdot (1+\varepsilon) \qquad (2)$$

where $\varepsilon=d/N_c$ represents the relative measurement error. Assuming a typical GSM/GPS measurement with period $N_c T_c = 1s$, $T_c=1/f_c=1/(26\text{ MHz})$, the worst case relative error for $d=1$ and $N_c=26\cdot 10^6$ is $\varepsilon \cong 0.04\cdot 10^{-6}$.

A square wave clock signal can be associated with $\phi(t)$, the phase of its Fourier fundamental frequency. $\phi(t)$ is a linear ramp which is characterized by the initial phase $\phi$ and the frequency f, and it is expressed by:

$$\phi(t)=2\pi ft+\phi. \qquad (3)$$

It is noted that $\phi(t)$ is understood to be unwrapped, i.e., not limited to the interval $[0,2\pi[$. In the following, the normalized phase is defined as $\eta(t)=\phi(t)/(2\pi)$ and the current value of a clock counter is $\hat{\eta}(t)$ denoted as $\hat{\eta}(t)$ Apparently, can be regarded as a quantized version of $\eta(t)$ which is formally expressed as follows:

$$\hat{\Theta}(t)=\lfloor \eta(t) \rfloor \qquad (4)$$

where the function $\lfloor x \rfloor$ represents the closest integer number equal to or less than x such that $0 \leq x-\lfloor x \rfloor<1$ applies. The triggering edge of the clock signal shall correspond to the clock phases $\eta(t) \bmod 1=0$. The quantization causes the smooth phase ramp $\eta(t)$ to become step-shaped. Furthermore, the expression $$\eta_c(t) = f_c t + \frac{\phi_c}{2\pi} \qquad (5)$$

is denoted as the non-quantized normalized phase of the collecting clock, and $$\eta_g(t)=f_g t \qquad (6)$$

as the non-quantized normalized phase of the gating clock, where $\eta_g(t=0)=0$ holds without loss of generality. It is noted that $\eta_g(t)$ can be considered as normalized time $\eta_g(t)=t/T_g$ likewise because of $f_g=1/T_g$. Substituting $t=\eta_g/f_g$ into Eq. (5) and dropping the time index for the sake of clarity, the following expression is obtained:

$$\eta_c\left(\frac{\eta_g}{f_g}\right) = \frac{f_c}{f_g}\eta_g + \frac{\phi_c}{2\pi}. \qquad (7)$$

In the light of Eq. (7), frequency measurements turn into the problem of estimating the steepness or slope of the phase ramp $\eta_c(\eta_g/f_g)$, which corresponds to the frequency ratio $f_c/f_g$.

In the following, we define $\eta_c[k]=\eta_c(k/f_g)$, where k is an integer and represents values of the gating clock counter being equal to integer values of the normalized phase $\eta_g$.

In the conventional approach, samples $\hat{\eta}_c[k_0]$ and $\hat{\eta}_c[k_1]$ are taken from the collecting counter as an approximation of $\eta_c[k_0]$ and $\eta_c[k_1]$. Here, $k_0$ and $k_1$ designate the first and the last value of the gating counter spanning the measurement period, and $\hat{\eta}_c[k]$ designates the value of the collecting counter at the beginning of the k-th gating clock period. However, the respective outcome of the estimation of the frequency ratio depends on the phase relation between the collecting clock and the gating clock. As a consequence the estimate of the desired frequency ratio $f_c/f_g$ spreads. Thus, estimating the slope of the non-quantized phase ramp $\eta_c[k]$ of the collecting clock based on observations of its quantized version $\hat{\eta}_c[k]$ is sub-optimal when it makes use of only two samples from $\hat{\eta}_c[k]$ As a solution to the above spreading problem, a multiple phase sampling and regression scheme has been proposed where a total of $N_g+1$ samples is taken from the collecting counter, given a measurement interval lasting $N_g=k_1-k_0$ gating clock cycles. Based on these $N_g+1$ samples, a regression line is calculated which leads to a better estimate of $\eta_c$ in terms of slope. For practical reasons, it may be desirable to consider a subset of the $N_g+1$ samples comprising only $M \leq N_g+1$ collecting counter samples where $\eta_g[m]$, $0 \leq m \leq M$, designate the corresponding gating counter values. Based on this subset the unknown parameters of the regression line, which are the normalized phase offset $a_0$ and slope $a_1$ are then determined based on statistical rules of the regression analysis as known in the art.

In the derivation of the linear regression algorithm, the relationship between the gating clock samples and the collection clock samples is approximated by the curve $$\hat{\eta}_c[\eta_g[m]] \approx a_0 + a_1 \eta_g[m],$$

where the best solutions for the phase offset $a_0$ and the slope $a_1$ are to be found by solving a least square's problem. In reality, however the approximation of the gating and collecting counters relationship by a linear function is in general sub-optimal. Therefore, there is still room for further improvement of frequency estimation.

It is therefore an object of the present invention to provide an improved phase and frequency measurement with higher accuracy.

Accordingly, an accurate frequency and phase measurement is provided, in which the actual non-linearity of the underlying problem is exploited in order to obtain frequency as well as phase measurement accuracies which can exceed by far those of the above known measurement principles. In fact, a significant reduction of the product of measurement error and measurement period can be achieved. Moreover, the same counter values already derived from a linear regression based algorithm can be used, such that no additional hardware is necessary. The underlying simple estimation principle can be implemented on microcontrollers or digital signal processors which are available in most electronic devices, e.g. mobile phones, where a corresponding measurement is to be performed. It may even be easily implemented in dedicated hardware.

As the relationship between the collecting clock and the gating clock is determined based on the non-linear step-shaped function, better estimates can be obtained for the slope and offset values required for estimation.

The estimation means may comprise first counter means for counting the collecting clock and second counter means for counting the gating clock, wherein the estimating means may be arranged to perform the estimation based on account values of the first and the second counter means. As already mentioned, the use of the first and second counter means provides the advantage that counter values already derived from other estimation schemes, such as the linear regression, can be used for the proposed estimation and no additional hardware is necessary.

Preferably, the estimating means may be arranged to perform the estimation by an iterative process. Using the iterative process, the estimation error can be improved by orders of magnitude with almost negligible complexity increase in signal processing. In particular, the estimating means may be arranged to calculate estimates for a minimum value and a maximum value of the frequency ratio between the collecting clock and the gating clock. These estimates may be calculated by using minimum and maximum values of the phase offset between the collecting clock and the gating clock.

Additionally, the estimating means may be arranged to calculate estimates for a minimum value and a maximum value of a phase offset between the collecting clock and the gating clock. These estimates may be calculated by using minimum and maximum values of the frequency ratio between the collecting clock and the gating clock. Minimum and maximum estimates for the slope can thus be determined when having an estimate for the phase offset, and minimum and maximum estimates for phase offset can be determined when having an estimate for the slope. In case of an iterative procedure, accuracy can be improved with each iteration step. The calculation can be carried out for several iteration steps if appropriate prior estimates are available. The estimation can thus be solved recursively in an iterative way.

As a further option, the estimating means may be arranged to average the estimates so as to obtain the frequency or phase. The initial values required for the iterative estimation may be obtained from estimates of another estimation function or from given system parameters. As an example, this other estimation function may be based on a regression. Thereby, coarse or rough estimates for the desired parameters can be used as a starting point of the proposed non-linear estimation scheme.

In view of the fact that the proposed estimation may easily be implemented in connection with processors or processing means in respective electronic devices, it may be implemented as a computer program product, e.g. stored on a record carrier or downloadable from a data network, wherein code means of the computer program product are adapted to control the processor means so as to produce the claimed method steps when loaded into the memory of the respective electronic device controlled by the processor means.

The present invention will now be described based on a preferred embodiment with reference to the accompanying drawings in which.

The preferred embodiment will now be described based on a frequency and phase estimation in a GSM mobile phone with GPS capability. However, it is to be noted that the proposed measurement scheme may as well be implemented in other electronic systems, such as CD systems or hard disc systems or the like, which are operated from independent clock oscillators.

Figure 1:
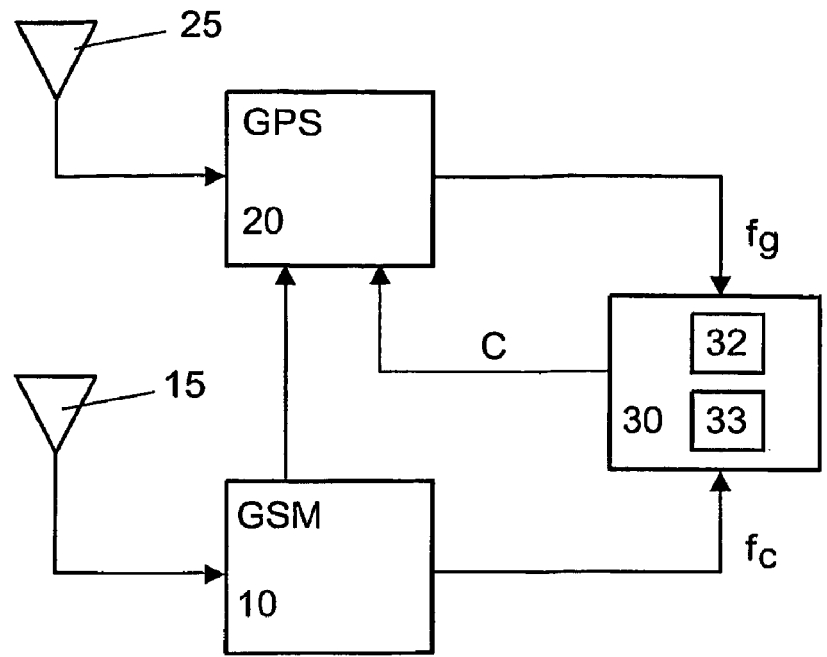
FIG. 1 shows a schematic block diagram of a mobile phone device according to the preferred embodiment of the present invention.

FIG. 1 shows a schematic block diagram of a mobile device which includes a GSM communication system 10, such as a cell phone, and a position location system, such as a GPS system 20. The cellular communication system 10 is connected to a first antenna 15 and comprises suitable devices, hardware, and software for communicating with and/or detecting signals from cellular base stations, including a local oscillator and an automatic frequency control (AFC) system which locks a local oscillator to a cellular base frequency. Furthermore, a GPS system 20 is provided which is connected to a GPS antenna 25 to receive GPS signals which are transmitted at or near the ideal GPS frequency. The GPS system 20 comprises any suitable hardware and software for receiving and processing GPS signals and performs any calculations necessary to determine position using any suitable position location algorithm.

In order to observe and predict errors in the local oscillator and calibrate the GPS receiver with respect to the GPS signal, an error processing and calibration system 30 is provided which receives the GPS local oscillator frequency from the GPS local oscillator and also receives the cellular oscillator frequency. In a frequency comparison unit, the two frequencies are monitored and measurements are periodically provided based on counting operators of a first counting unit 32 for counting in response to the GPS local oscillator frequency and a second counter unit 33 for counting in response to the cellular oscillator frequency. In particular, the ratio of the frequencies can be computed using a frequency counting type procedure in which the frequency of the cellular oscillator is used as a time base and the GPS oscillator is used for delivering the frequency to be counted. As to achieve minimum measurement errors, the clock with the smaller frequency is used as gating clock with frequency $f_g$ and the clock with the higher frequency is used as collecting clock with frequency $f_c$. However, it may also be vice versa. Typically, a fixed number of cycles of the time base are counted to establish a time interval. Based on the frequency and/or phase measurement, the error prediction and calibration system 30 may generate a correction signal C supplied to the GPS system 20. The correction signal may be supplied to the GPS local oscillator which in response adjusts the output GPS local oscillator frequency to correct for the predicted error. Alternatively, based on the frequency and/or phase measurement a correction of the GPS signal may be carried out by means of digital postprocessing.

In the following, the frequency and phase measurement process as performed in the error prediction and calibration system 30 is described in more detail with reference to FIGS. 2 and 3.

Figure 2:
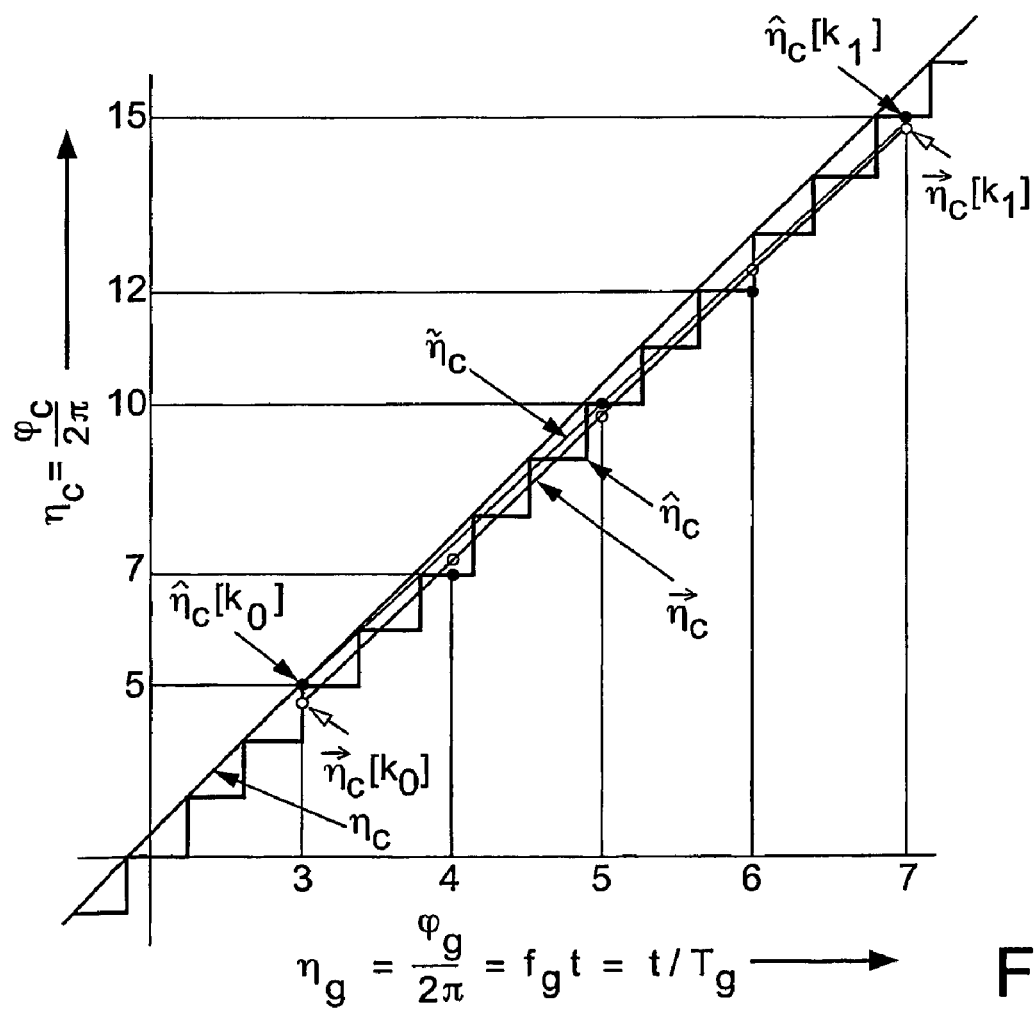
FIG. 2 shows a schematic diagram showing the basic principle of the proposed measurement approach according to the preferred embodiment.

FIG. 2 shows a diagram indicating normalized phase $\eta_c$ of the collecting clock versus normalized phase $\eta_g$ of the gating clock, where $k_0$ and $k_1$ designate the first and last value of the gating counter spanning the measurement period $\hat{\eta}_c[k]$ designates the value of the collecting counter at the beginning of the k-th gating clock period. The line $\bar{\eta}_c$ can be regarded as an approximation of $\eta_c$ based on the initially described conventional approach, while the line $\eta_c$ indicates the slope of the actual phase. The curve or line corresponds to the initially described regression line where the regression line samples $\vec{\eta}_c$ are marked by hollow dots. According to the preferred embodiment, the true non-linear $\vec{\eta}_c[k]$ and stepwise shape of the curve representing the counting operation of the collecting counter and thus the values of $10\hat{\eta}_c$ the normalized phase is exploited for phase and frequency measurement purposes. In fact, the relationship of the corresponding counter values is given as follows:

$$\hat{\eta}_c[\eta_g[m]] = \lfloor a_0 + a_1 \eta_g[m] \rfloor. \tag{8}$$

Hence, solving those values $a_0$ and $a_1$ which satisfy the relationship described by Eq. (8) yields in principle better estimates than obtained from the above conventional or regression line approaches. The tuples $(a_0, a_1)$ which solve the above problem are members of a large set S. In theory, the set S contains an infinite number of tuples where the difference between the maximum and minimum values for the phase offset $a_0$ and the slope $a_1$ rely on various parameters like subset size M, frequency ratio of the gating and collecting clock, etc. Hence, for determination of virtually the whole set S, a search over a huge number of trial tuples has to be carried out. Depending on the granularity of the trial tuples, this search requires a significant complexity which makes it infeasible for practical use.

Thus, a low complexity approach is proposed. In addition, regarding the fact that with rising M and increasing measurement period the difference between all tuples in the set S becomes small, the search can be restricted to the determination of a single tuple $(a_0, a_1)$ in the set S. That is, it is proposed not to determine the whole set S, but only a single member of that set.

$$\hat{\eta}_c[\eta_g[m]] \leq a_0 + a_1 \eta_g[m] < \hat{\eta}_c[\eta_g[m]] + 1. \tag{9}$$

In order to determine this tuple, the following relationship can be used:

After straightforward calculations, this equation yields that the slope $a_1$ can vary for a given phase offset $a_0$ in the range:

$$\frac{\hat{\eta}_c[\eta_g[m]] - a_0}{\eta_g[m]} \leq a_1 < \frac{\eta_c[\eta_g[m]] + 1 - a_0}{\eta_g[m]} \tag{10}$$

while we get vice versa for the same phase offset's range for a given slope $a_1$:

$$\hat{\eta}_c[\eta_g[m]] - a_1 \eta_g[m] \leq a_0 < \hat{\eta}_c[\eta_g[m]] + 1 - a_1 \eta_g[m]. \tag{11}$$

That is, minimum and maximum estimates $a_{1,min}$, $a_{1,max}$ can be determined for the slope when having an estimate for the phase offset $a_0$, and minimum and maximum estimates $a_{0,min}$, $a_{0,max}$ can be determined for the phase offset when having an estimate for the slope $a_1$.

Moreover, supposing that minimum and maximum estimates $a_{0,min}$, $a_{0,max}$ are given for the phase offset, minimum and maximum estimates $a_{1,min}$, $a_{1,max}$ for the slope can be obtained due to strict monotonicity of the left and right hand side of Eq. (10):

$$a_{1,min} = \frac{\hat{\eta}_c[\eta_g[m]] - a_{0,max}}{\eta_g[m]}, \quad (12)$$

$$a_{1,max} = \frac{\hat{\eta}_c[\eta_g[m]] + 1 - a_{0,min}}{\eta_g[m]}.$$

In the same way the minimum and maximum estimates $a_{0,min}$, $a_{0,max}$ can be determined for the phase offset if minimum and maximum estimates $a_{1,min}$, $a_{1,max}$ are available for the slope from Eq. (11) as follows:

$$a_{0,min} = \hat{\eta}_c[\eta_g[m]] - a_{1,max}\eta_g[m],$$

$$a_{0,max} = \hat{\eta}_c[\eta_g[m]] + 1 - a_{1,min}\eta_g[m]. \quad (13)$$

The above calculations can be carried out for all indices $0 \leq m \leq M$ if appropriate a priori estimates are available. This task can be solved recursively in an iterative way. However, if a sub-optimal estimation or measurement is sufficient, the minimum and maximum value can be calculated only once and the estimation can be based on obtaining an average value or another final value based on the obtained minimum and maximum values.

In the following, the proposed measurement procedure is described with reference to FIG. 3.

Figure 3:
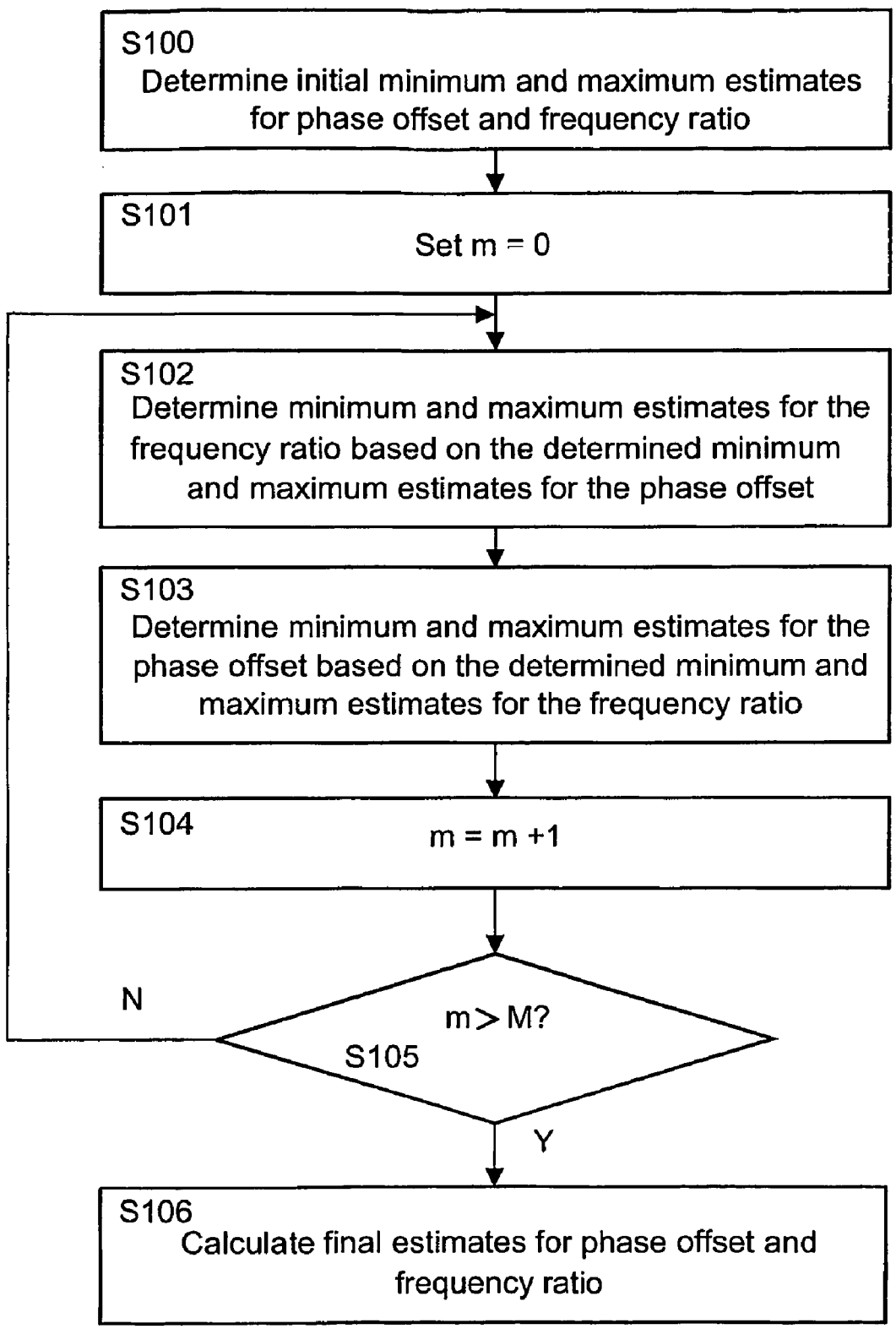
FIG. 3 shows a schematic flow diagram of a phase and frequency measurement according to the preferred embodiment.

FIG. 3 shows a schematic flow diagram of the frequency and phase measurement procedure according to the preferred embodiment.

In step S100 an initialization is performed by determining initial minimum and maximum estimates for the phase offset $a_0$ and the frequency ratio or slope $a_1$. The initial values may be obtained based on the following equations:

$$a_{0,min} = \phi_n - \Delta\phi \quad (14)$$

$$a_{0,max} = \phi_n + \Delta\phi$$

$$a_{1,min} = \frac{f_{c,n}}{f_{g,n}} - \Delta f$$

$$a_{1,max} = \frac{f_{c,n}}{f_{g,n}} + \Delta f$$

where $\phi_n$ denotes the nominal phase offset, $\Delta\phi$ denotes the phase offset uncertainty, $f_{c,n}$ denotes the nominal collecting clock frequency, $f_{g,n}$ denotes the nominal gating clock frequency, and $\Delta f$ denotes the frequency ratio uncertainty.

Then, in step S101 a running parameter m which is incremented for each sampling index is set to zero.

In step S102, minimum and maximum estimates for the frequency ratio based on the determined minimum and maximum estimates for the phase offset are determined. Additionally, in step S103, minimum and maximum estimates for the phase offset are determined based on the determined minimum and maximum estimates for the frequency ratio. The determinations in steps S102 and S103 are based on the following equations:

$$a_{0,min} = \min(\max(\hat{\eta}_c[\eta_g[m]] - a_{1,max}\eta_g[m], a_{0,min}), a_{0,max}), \quad (15)$$

$$a_{0,max} = \max(\min(\hat{\eta}_c[\eta_g[m]] - a_{1,min}\eta_g[m], a_{0,max}), a_{0,min}),$$

$$a_{1,min} = \min\left(\max\left(\frac{\hat{\eta}_c[\eta_g[m]] - a_{0,max}}{\eta_g[m]}, a_{1,min}\right), a_{1,max}\right),$$

$$a_{1,max} = \max\left(\min\left(\frac{\hat{\eta}_c[\eta_g[m]] + 1 - a_{0,min}}{\eta_g[m]}, a_{1,max}\right), a_{1,min}\right).$$

wherein the order of steps S102 and S103 may as well be changed.

Then, in step S104, the running parameter m is incremented for the next sampling index. In step S105, it is checked whether the maximum number m of samples of the collecting counter has been exceeded. If not, the procedure jumps back to step S102 for performing the calculations of the minimum and maximum estimates for the next sample. If the maximum number M has been exceeded in step S105, the procedure continues with step S106 or, if an iterative measurement is chosen, with a next one of a predetermined number of iterations of steps S101 to S105.

In the latter case, a second running variable and decision block has to be introduced into the flow diagram of FIG. 3 as a second loop for controlling the number of iterations.

Finally, in step S106, final estimates are derived for the phase offset $a_0$ and the frequency ratio $a_1$. This calculation may be based on an averaging step as defined in the following equations:

$$a_0 = \frac{(a_{0,min} + a_{0,max})}{2}, \quad (16)$$

$$a_1 = \frac{(a_{1,min} + a_{1,max})}{2}.$$

The update rules in Eq. (15) are obtained from Eqs. (12) and (13) bearing in mind that a new minimum/maximum estimate has to be larger/smaller than or equal to the current minimum/maximum estimate and smaller/larger than or equal to the current maximum/minimum estimate.

The initialization values for the iteration in step S100 can be calculated from given system parameters. In fact, when starting the counters 32 and 33 of FIG. 1 randomly so that the phase offset is equally distributed for all possible values, the nominal phase offset $\phi_n$ and the phase offset uncertainty $\Delta\phi$ can be chosen as follows:

$$\phi_n = \frac{f_{c,n}}{2f_{g,n}}, \quad (17)$$

$$\Delta\phi = \frac{f_{c,n}}{2f_{g,n}}.$$

The nominal collecting and gating clock frequencies are known a priori, and the corresponding frequency ratio uncertainty can be easily calculated from the maximum magnitude of the clock frequency offset:

$$\Delta f_o = \max|f_c - f_{c,n}| + \max|f_g - f_{g,n}| \qquad (18)$$

as follows:

$$\Delta f = \frac{\Delta f_o}{f_{c,n}}. \qquad (19)$$

Alternatively, the initial values can be obtained by running another low complex estimation algorithm in advance which provides coarse estimates for the desired parameters, e.g. the initially described regression algorithm.

In the following, simulation results obtained for the above proposed iterative estimation or measurement approach are described in connection with FIGS. 4 to 6. In these simulations, a nominal collection clock frequency of $f_{c,n}$=26 MHz and a nominal gating clock frequency of $f_{g,n}$=5.265 MHz have been chosen. In addition, in order to account for an offset of the actual clock frequency from the nominal clock frequency, the true gating clock frequency $f_g$ is offset by up to ±40 ppm (parts per million), i.e., ±210 Hz, from its nominal value, while $f_c = f_{c,n}$ is chosen for the collecting clock frequency.

First, a fixed measurement time of $T_{meas}$=1 s has been chosen. M=10, ..., $10^4$ values have been recorded from the collecting counter taken from a so-called jittered grid as described in Peter Bode, Alexander Lampe, Markus Helfenstein, and Michael Gollnick, "Improved Method for Measuring Frequency ratios in GSM Mobile Phones", in Proc. IEEE Custom Integrated Circuits Conference, Orlando, Fla., October 2004.

For each value M 1000 trials have been carried out while choosing for each trial the true gating clock frequency equally likely from the interval [5.265 MHz−210. Hz, 5.265 MHz+210 Hz]. In addition, for each trial the phase offset has been chosen equally likely from the interval [0, $f_{c,n}/f_{g,n}$], too.

The phase offset $a_0$ and frequency ratio $a_1$ were estimated for each trial with the regression algorithm as well as the proposed iterative algorithm according to the preferred embodiment yielding $a_{0,reg}$ and $a_{1,reg}$ as well $a_{0,iter}$ and $a_{1,iter}$, respectively. For the iterative algorithm three iterations were carried out, that is, in the flow diagram of FIG. 3, the loop procedure of steps S101 to S105 has been carried out three times.

From the frequency ratios, the actual gating clock frequency is subsequently obtained as:

$$f_{g,reg/iter} = \frac{f_c}{a_{1,reg/iter}}. \qquad (20)$$

The corresponding relative frequency error and absolute phase offset error can be obtained as follows:

$$\varepsilon_{f,reg/iter} = 1 - \frac{f_{g,reg/iter}}{f_g} = 1 - \frac{f_c}{f_g} \cdot \frac{1}{a_{1,reg/iter}}, \qquad (21)$$

$$\varepsilon_{\phi,reg/iter} = \phi - a_{0,reg/iter}.$$

Figure 4:
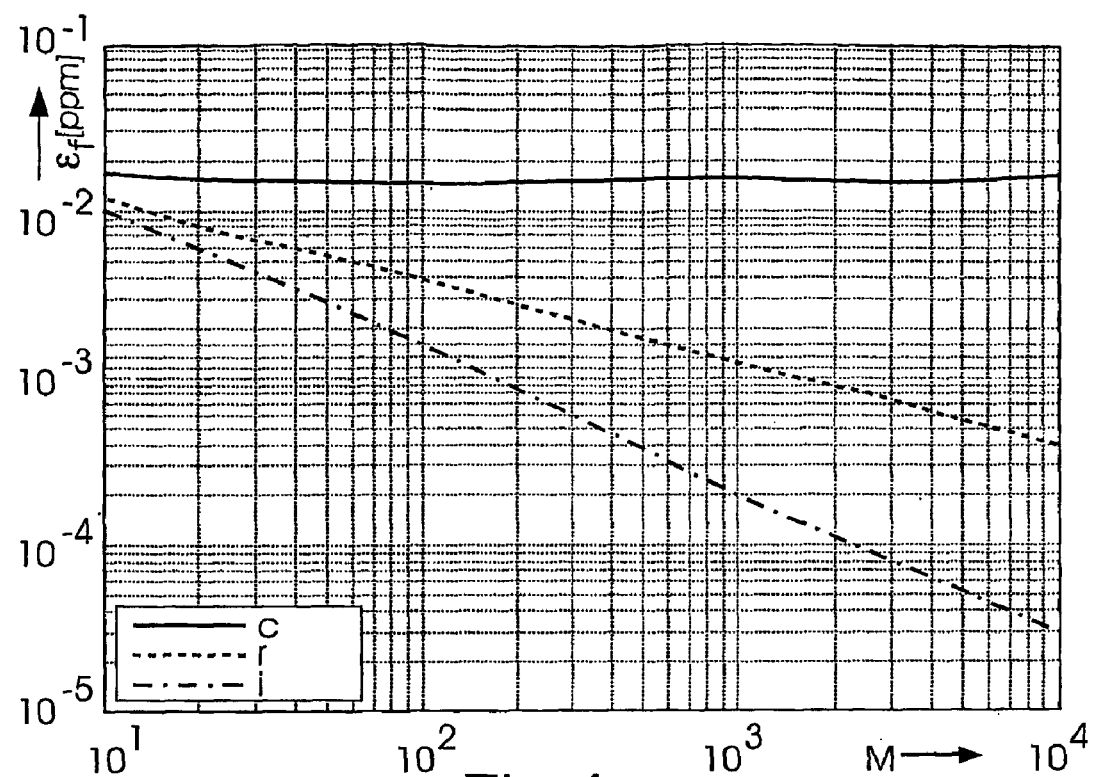
FIG. 4 shows a diagram indicating relative frequency error versus number of samples for the measurement according to the preferred embodiment in comparison with conventional measurement approaches.
Figure 5:
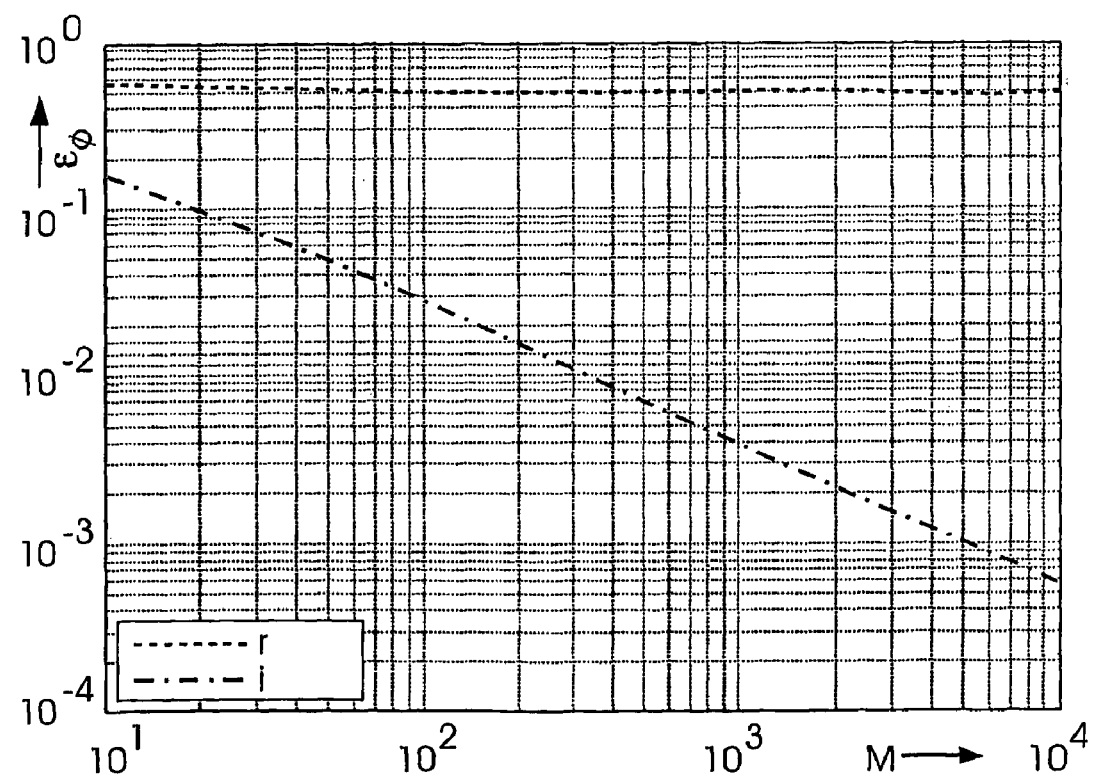
FIG. 5 shows a diagram indicating absolute phase error versus number of samples for the proposed measurement according to the preferred embodiment in comparison with conventional measurement approaches.

FIGS. 4 and 5 show the resulting RMS value of $\varepsilon_f$ in ppm versus the number M of samples, and $\varepsilon_\phi$ versus the number M of samples, respectively, for the fixed total measurement time of $T_{meas}$=1 s. The RMS value is averaged over all trials for one particular index set cardinality M. For comparison, in FIG. 4, the relative frequency estimation error resulting from the initially described conventional method is also depicted. In particular, the continuous line indicates the results of the conventional method c, the dashed line indicates the results of the regression method r, and the dash-dotted line indicates the results of proposed iterative method i.

It can be gathered from FIGS. 4 and 5 that the proposed method i outperforms the conventional method c as well as the regression method r by orders of magnitude with rising numbers of samples M. In fact, while the frequency error of the regression method r is almost proportional to $\sqrt{M}$, the frequency error of the iterative method i is almost proportional to M. In addition, the phase error decreases proportional to rising M when the iterative method i is applied while it is constant for the regression method r. It is noted that no phase estimation error curve can be given for the conventional method C, as it doesn't provide a phase estimate.

Figure 6:
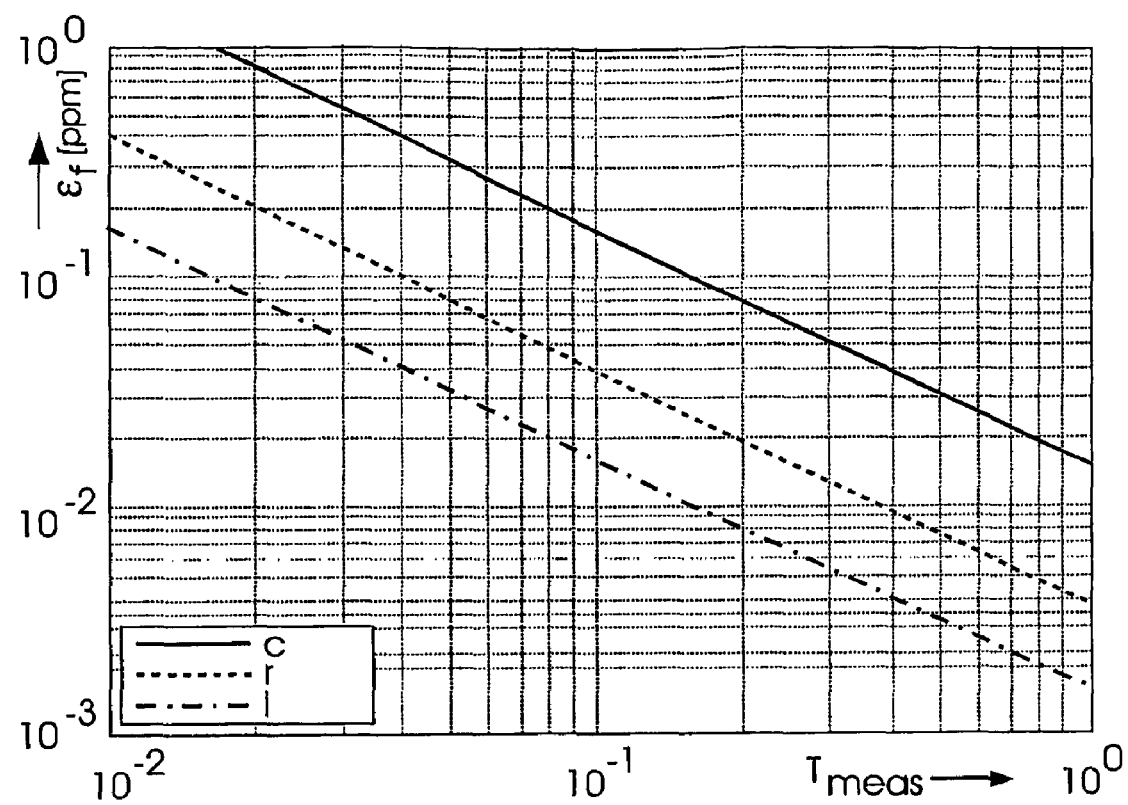
FIG. 6 shows a diagram indicating frequency error versus measurement time for the proposed measurement according the preferred embodiment in comparison with conventional measurement approaches.

The superiority of the new non-linear method i is also confirmed by the results given in FIG. 6. It shows a diagram of RMS frequency error versus measurement time with a sampling number M=100. Here, the RMS frequency estimation errors are compared for different measurement times $T_{meas}$=0.01 s, ..., 1 s, while the number of samples is fixed to M=100. For each value M 1000 trials have been carried out while choosing for each trial the true gating clock frequency equally likely from the interval [5.265 MHz-210 Hz, 5.265 MHz+210 Hz]. In addition, for each trial the phase offset is chosen equally likely from the interval [0, $f_{c,n}/f_{g,n}$], too. As before, three iterations were carried out for the proposed non-linear iterative method i.

In summary, an accurate frequency and phase measurement algorithm is proposed which is based on a non-linear technique, optionally involving iterations. Compared to conventional approaches as well as recently proposed regression based solutions, it can be shown that the estimation error can be improved by up to orders of magnitude with almost negligible complexity increase in signal processing.

It is noted that the present invention is not restricted to the above preferred embodiment but can be used in any electronic circuit which is operated from independent clock oscillators. Furthermore, the proposed method is not restricted to the calculation of the minimum and maximum estimates as expressed in equations (12) to (16). Rather, any known approximation of the non-linear stepwise function indicated in FIG. 2 is considered to be covered by the present invention. The preferred embodiments may thus vary within the scope of the attached claims.

It must further be noted that the term 'comprising' when used in the specification including the claims is intended to specify the presence of stated features, means, steps or components, but does not exclude the presence or addition of one or more other features, means, steps, components or groups thereof. Furthermore, the word 'a' or 'an' preceding an element in a claim does not exclude the presence of a plurality of such elements. Moreover, any reference signs do not limit the scope of the claims. The invention can be implemented by means of both hardware and software, and several 'means' may be represented by the same item or hardware.

The invention claimed is:

1. An apparatus for measuring at least one of a frequency ratio and a phase offset, said apparatus comprising:
   gating control means for generating a gating clock based on said at least one of the frequency ratio and the phase offset;
   collecting control means for generating a collecting clock at a frequency derived from a reference signal; and estimating means for estimating said frequency ratio by calculating maximum and minimum estimates for said frequency ratio based at least on calculated minimum and maximum estimates of said phase offset, respectively, and for estimating said phase offset by calculating maximum and minimum estimates for said phase offset based at least on calculated minimum and maximum estimates of said frequency ratio, respectively, wherein said frequency ratio is a ratio between frequencies of said collecting clock and said gating clock, and wherein said phase offset is an offset between said collecting clock and said gating clock.

2. An apparatus as claimed in claim 1, wherein said estimating means comprises first counter means for counting said collecting clock and second counter means for counting said gating clock, and wherein said estimating means is arranged to perform said estimation based on count values of said first and second counter means at an instance in time.

3. An apparatus according to claim 2, wherein said estimating means estimates both of said frequency ratio and said phase offset by an iterative process utilizing the count values of said first and second counter means at the instance in time.

4. An apparatus according to claim 1, wherein said estimating means is arranged to calculate said maximum and minimum estimates for said phase offset between said collecting clock and said gating clock based at least on calculated minimum and maximum estimates of said phase offset.

5. An apparatus according to claim 4, wherein said estimating means is arranged to calculate said maximum and minimum estimates for said frequency ratio based at least on calculated minimum and maximum estimates of said frequency ratio.

6. An apparatus according to claim 5, wherein said estimating means is arranged to average said maximum and minimum estimates of said frequency ratio to obtain said frequency and average said maximum and minimum estimates of said phase ratio to obtain said phase.

7. An apparatus according to claim 5, wherein said estimating means is arranged to derive initial values of said minimum and maximum values from estimates of another estimation function or from given system parameters.

8. An apparatus according to claim 7, wherein said other estimation function is based on a regression.

9. An apparatus according claim 1, wherein said at least one of the frequency ratio and the phase offset is used as gating clock and said reference signal is used as collecting clock.

10. A method of measuring at least one of a frequency ratio and a phase offset, said method comprising:
generating a gating clock based on said at least one of the frequency ratio and the phase offset;
generating a collecting clock at a frequency derived from a reference signal;
calculating minimum and maximum estimates for said frequency ratio based at least on maximum and minimum estimates of said phase offset, respectively, said frequency ratio being a ratio between frequencies of said collecting clock and said gating clock;
calculating minimum and maximum estimates for said phase offset based at least on maximum and minimum estimates of said frequency ratio, respectively, said phase offset being an offset between said collecting clock and said gating clock;
estimating said frequency ratio based at least on said calculated minimum and maximum estimates for said frequency ratio; and
estimating said phase offset based at least on said calculated minimum and maximum estimates for said phase offset, wherein at least one of the generating, calculating, and estimating steps is performed by at least one processor.

11. The method of claim 10, wherein said at least one of the frequency ratio and the phase offset is used as said gating clock and said reference signal is used as said collecting clock.

12. The method of claim 10, comprising:
sampling a counter of said collecting clock and a counter of the said gating clock at an instance in time.

13. The method of claim 10 wherein estimating said frequency ratio based at least on said calculated minimum and maximum estimates for said frequency ratio includes determining said frequency ratio from an average of said calculated minimum and maximum estimates for said frequency ratio.

14. The method of claim 10 wherein estimating said phase offset based at least on said calculated minimum and maximum estimates for said phase offset includes determining said frequency ratio from an average of said calculated minimum and maximum estimates for said phase offset.

15. The method of claim 10 wherein estimating said frequency ratio based at least on said calculated minimum and maximum estimates for said frequency ratio and estimating said phase offset based at least on said calculated minimum and maximum estimates for said phase offset includes deriving initial values of said minimum and maximum estimates for said frequency ratio and said minimum and maximum estimates for said phase offset.

16. The method of claim 10, wherein the at least one processor includes one or more of dedicated hardware, a microprocessor, and a digital signal processor.

17. A non-transitory computer-readable medium having code for causing a processor to implement a method of measuring a frequency ratio and a phase offset, comprising:
generating a gating clock based on said measuring the frequency ratio and a phase offset;
generating a collecting clock at a frequency derived from a reference signal;
calculating minimum and maximum estimates for said frequency ratio based at least on maximum and minimum estimates of said phase offset, respectively, said frequency ratio being a ratio between frequencies of said collecting clock and said gating clock;
calculating minimum and maximum estimates for said phase offset based at least on maximum and minimum estimates of said frequency ratio, respectively, said phase offset being an offset between said collecting clock and said gating clock;
estimating said frequency ratio based at least on said calculated minimum and maximum estimates for said frequency ratio; and
estimating said phase offset based at least on said calculated minimum and maximum estimates for said phase offset.

18. The computer-readable medium of claim 17 wherein the code comprises:
sampling a counter of said collecting clock and a counter of the said gating clock at an instance in time.

19. The computer-readable medium of claim 17 wherein estimating said frequency ratio based at least on said calculated minimum and maximum estimates for said frequency ratio includes determining said frequency ratio from an average of said calculated minimum and maximum estimates for said frequency ratio.

20. The computer-readable medium of claim 17 wherein estimating said phase offset based at least on said calculated minimum and maximum estimates for said phase offset includes determining said frequency ratio from an average of said calculated minimum and maximum estimates for said phase offset.

21. The computer-readable medium of claim 17 wherein estimating said frequency ratio based at least on said calculated minimum and maximum estimates for said frequency ratio and estimating said phase offset based at least on said calculated minimum and maximum estimates for said phase offset includes deriving initial values of said minimum and maximum estimates for said frequency ratio and said minimum and maximum estimates for said phase offset.

22. A non-transitory computer-readable medium having code for causing a processor to implement a method of measuring a frequency ratio and a phase offset, comprising:
   generating a gating clock based on said measuring the frequency ratio and a phase offset;
   generating a collecting clock at a frequency derived from a reference signal;
   estimating said frequency ratio and said phase offset by approximating a relationship between said collecting clock and said gating clock based on a non-linear step-shaped function;
   providing a correction to the gating clock based at least on the frequency ratio and the phase offset, and wherein estimating said frequency ratio and said phase further includes:
      prior to providing the correction, collecting a set of pairs of counter values, each pair of counter values including a respective value of a count of a number of cycles of the gating clock at an instance of time and a respective value of a count of a number of cycles of the collecting clock at the same instance of time, wherein the set of pairs of counter values includes a number (M) of member pairs, where M is greater than one;
      prior to providing the correction, recursively determining a current maximum value and a current minimum value of the phase offset for each pair of counter values based at least on a previous maximum value and a previous minimum value of the phase offset and a previous maximum value and a previous minimum value of the frequency ratio of the collecting clock relative to the gating clock, wherein at least (M−1) of the respective previous minimum and maximum values of the phase offset are determined based at least on the set of counter values, and wherein at least (M−1) of the respective previous minimum and maximum values of the frequency ratio are determined based at least on the set of counter values; and
      prior to providing the correction, recursively determining a current maximum value and a current minimum value of the frequency ratio for each pair of counter values based at least on the previous maximum value and the previous minimum value of the phase offset and the previous maximum value and the previous minimum value of a frequency ratio.

23. The computer-readable medium of claim 22 wherein the code further comprises:
   prior to determining the current maximum value and the current minimum value of the phase offset and prior to determining the current maximum value and the current minimum value of the frequency ratio,
      estimating a first maximum value and a first minimum value of the phase offset, and
      estimating a first maximum value and a first minimum value of the frequency ratio.

24. The computer-readable medium of claim 22 wherein the code further comprises:
   determining a final value of the phase offset based at least on the current maximum value and the current minimum value of the phase offset; and
   determining the final value the frequency ratio based at least on the current maximum value and the current minimum value of the frequency ratio.

25. The computer-readable medium of claim 22 wherein for each pair of counter values, the current maximum value and the current minimum value of the phase offset is determined based at least on the respective pair of counter values and the current maximum value and the current minimum value of the frequency ratio is determined based at least on the respective pair of counter values.

26. The computer-readable medium of claim 25 wherein the code further comprises:
   repeating for a number of iterations,
      determining the current maximum value and the current minimum value of the phase offset for each pair of counter values, and
      determining the current maximum value and the current minimum value of the frequency ratio for each pair of counter values.

27. A method of measuring at least one of a frequency ratio and a phase offset, comprising:
   generating a gating clock based on said at least one of the frequency ratio and the phase offset;
   generating a collecting clock at a frequency derived from a reference signal;
   estimating the at least one of said frequency ratio and said phase offset by approximating a relationship between said collecting clock and said gating clock based on a non-linear step-shaped function;
   providing a correction to the gating clock based at least on the frequency ratio and the phase offset, and wherein estimating said frequency and said phase further includes:
      prior to providing the correction, collecting a set of pairs of counter values, each pair of counter values including a respective value of a count of a number of cycles of the gating clock at an instance of time and a respective value of a count of a number of cycles of the collecting clock at the same instance of time, wherein the set of pairs of counter values includes a number (M) of member pairs, where M is greater than one;
      prior to providing the correction, recursively determining a current maximum value and a current minimum value of the phase offset for each pair of counter values based at least on a previous maximum value and a previous minimum value of the phase offset and a previous maximum value and a previous minimum value of the frequency ratio of the collecting clock relative to the gating clock, wherein at least (M−1) of the respective previous minimum and maximum values of the phase offset are determined based at least on the set of counter values, and wherein at least (M−1) of the respective previous minimum and maximum values of the frequency ratio are determined based at least on the set of counter values; and
      prior to providing the correction, recursively determining a current maximum value and a current minimum value of the frequency ratio for each pair of counter values based at least on the previous maximum value and the previous minimum value of the phase offset and the previous maximum value and the previous minimum value of the frequency ratio, wherein at least one of the generating, estimating, and providing steps is performed by at least one processor.

28. The method of claim 27, further comprising:
prior to determining the current maximum value and the current minimum value of the phase offset and prior to determining the current maximum value and the current minimum value of the frequency ratio,
   estimating a first maximum value and a first minimum value of the frequency offset, and
   estimating a first maximum value and a first minimum value of the frequency ratio.

29. The method of claim 27, further comprising:
determining a final value of the phase offset based at least on the current maximum value and the current minimum value of the phase offset; and
determining the final value the frequency ratio based at least on the current maximum value and the current minimum value of the frequency ratio.

30. The method of claim 27 wherein for each pair of counter values, the current maximum value and the current minimum value of the phase offset is determined based at least on the respective pair of counter values and the current maximum value and the current minimum value of the frequency ratio is determined is also based on the respective pair of counter values.

31. The method of claim 27, further comprising:
repeating for a number of iterations,
   determining the current maximum value and the current minimum value of the phase offset for each pair of counter values, and
   determining the current maximum value and the current minimum value of the frequency ratio for each pair of counter values.

32. The method of claim 27, wherein the at least one processor includes one or more of dedicated hardware, a microprocessor, and a digital signal processor.

33. A method of generating a correction to a gating clock, comprising:
counting a first number of cycles of a collecting clock over a time period that is a fixed number of cycles of the gating clock with a collecting clock counter, the collecting clock having a frequency higher than a frequency of the gating clock;
counting a second number of cycles of the gating clock over the same time period with a gating clock counter;
collecting a set of pairs of counter values, each pair of counter values includes a respective value of the collecting clock counter and a respective value of the gating clock counter at an instance in time during the time period;
estimating a frequency ratio of the collecting clock relative to the gating clock and a phase offset of the gating clock based at least on a counter value of the collecting clock counter and a counter value of the gating clock counter;
determining a current value of the frequency ratio based at least on a previous value of the frequency ratio and a previous value of the phase offset, wherein determining the current value of the frequency ratio includes determining a current value of the phase offset for each respective pair of counter values;
determining a current value of the phase offset based at least on the previous value of the frequency ratio and the previous value of the phase offset, wherein determining the current value of the phase offset includes determining the current value of the frequency ratio for each respective pair of counter values; and
calibrating the gating clock based on the current value of the phase offset and the frequency ratio, wherein at least one of the counting, collecting, estimating, determining, and calibrating steps is performed by at least one processor.

34. The method of claim 33 wherein determining the current value of the phase offset for each respective pair of counter values includes determining a current minimum value of the phase offset and a current maximum value of the phase offset for each respective pair of counter values based at least on a previous maximum value and a previous minimum value of the phase offset and a previous maximum value and a previous minimum value of a frequency ratio; and wherein determining the current value of the frequency ratio for each respective pair of counter values includes determining a current minimum value of the frequency ratio and a current maximum value of the frequency ratio for each respective pair of counter values based at least on the previous maximum value and the previous minimum value of the phase offset and the previous maximum value and the previous minimum value of a frequency ratio.

35. The method of claim 33, wherein the at least one processor includes one or more of dedicated hardware, a microprocessor, and a digital signal processor.

* * * * *